United States Patent
Fifield

(10) Patent No.: US 8,831,154 B2
(45) Date of Patent: Sep. 9, 2014

(54) RADIO RECEIVER GAIN CONTROL

(75) Inventor: Robert Fifield, Gurnard (GB)

(73) Assignee: NXP, B.V., Eindhoven (NL)

( * ) Notice: Subject to any disclaimer, the term of this patent is extended or adjusted under 35 U.S.C. 154(b) by 109 days.

(21) Appl. No.: 12/936,689

(22) PCT Filed: Apr. 2, 2009

(86) PCT No.: PCT/IB2009/051395
§ 371 (c)(1),
(2), (4) Date: Oct. 7, 2010

(87) PCT Pub. No.: WO2009/125322
PCT Pub. Date: Oct. 15, 2009

(65) Prior Publication Data
US 2011/0033013 A1   Feb. 10, 2011

(30) Foreign Application Priority Data
Apr. 8, 2008  (EP) .................................. 08103435

(51) Int. Cl.
*H04L 27/08* (2006.01)
*H03K 9/00* (2006.01)
*H03G 3/30* (2006.01)
*H03G 3/00* (2006.01)

(52) U.S. Cl.
CPC ............ *H03G 3/3089* (2013.01); *H03G 3/002* (2013.01)
USPC .......................................... 375/345; 375/316

(58) Field of Classification Search
USPC .................................. 375/345, 316
See application file for complete search history.

(56) References Cited

U.S. PATENT DOCUMENTS

| | | | |
|---|---|---|---|
| 4,250,548 A * | 2/1981 | Kindell | 712/300 |
| 5,436,626 A * | 7/1995 | Fujiwara et al. | 341/67 |
| 6,405,092 B1 * | 6/2002 | Oxford | 700/94 |
| 6,459,458 B1 * | 10/2002 | Balaban | 348/678 |
| 6,628,999 B1 * | 9/2003 | Klaas et al. | 700/94 |
| 2003/0039247 A1 * | 2/2003 | Henriksson et al. | 370/389 |
| 2003/0083031 A1 * | 5/2003 | Eriksson et al. | 455/250.1 |
| 2004/0021595 A1 * | 2/2004 | Erdogan et al. | 341/144 |
| 2006/0239387 A1 | 10/2006 | Orihashi et al. | |
| 2008/0266941 A1 * | 10/2008 | Lee et al. | 365/163 |

FOREIGN PATENT DOCUMENTS

| | | |
|---|---|---|
| EP | 0 795 818 A1 * | 9/1997 |
| EP | 0 7985 818 A * | 9/1997 |
| EP | 07985818 A1 * | 9/1997 |
| EP | 1 309 093 A2 | 5/2003 |
| GB | 2 396 493 A | 6/2004 |
| WO | 2004/095709 A2 | 11/2004 |

OTHER PUBLICATIONS

International Search Report and Written Opinion for Int'l. Patent Appln. No. PCT/IB2009/051395 (4-22009).

* cited by examiner

*Primary Examiner* — Chieh M Fan
*Assistant Examiner* — Brian J Stevens

(57) ABSTRACT

A radio receiver (100) comprises an analogue to digital converter (30) for generating a data word representative of a received radio signal and a gain control stage (40) comprising a first register (42) for storing the data word. The gain control stage (40) is adapted to control the numerical value of the data word by controlling the position of the data word in the first register (42).

20 Claims, 2 Drawing Sheets

RADIO RECEIVER GAIN CONTROL

FIELD OF THE INVENTION

The invention relates to a radio receiver and to a method of operating a radio receiver, in particular to gain control in a receiver employing digital processing of signals. The invention has application in, for example, receivers for cellular telephony, wireless local area networks and digital television.

BACKGROUND TO THE INVENTION

In a typical radio receiver analogue filters eliminate interferers from a received signal and an automatic gain control (AGC) loop ensures that an analogue wanted signal is passed to an analogue to digital converter (ADC) at a suitable level. Subsequent processing of the wanted signal then takes place at baseband in the digital domain. In a highly digitised radio receiver the received signal may be converted into the digital domain earlier in the receiver chain, usually by using a highly oversampled sigma delta ADC, at a point where interfering signals are still present and consequently a large dynamic range is required to characterise the signal. In this case, even with AGC prior to the ADC, the digital processing may require a large word length in order to accommodate the signal in all circumstances.

The present invention seeks to provide improvements in gain control.

SUMMARY OF THE INVENTION

According to a first aspect of the invention there is provided a radio receiver comprising an analogue to digital converter for generating a data word representative of a received radio signal, and a gain control stage comprising a first register for storing the data word, the gain control stage being adapted to control the numerical value of the data word by controlling the position of the data word in the first register.

According to a second aspect of the invention there is provided a method of operating a radio receiver comprising using an analogue to digital converter to generate a data word representative of a received radio signal and applying gain control to the data word by controlling the numerical value of the data word by controlling the position of the data word in a first register.

The invention, therefore, provides gain control after digitisation of a received signal by controlling the numerical value of data words produced by the digitisation. The gain control is provided by controlling the position of each data word in a register. Such a gain control scheme has low complexity and a well defined performance.

Optionally, the gain control stage may be adapted to change the length of the data word. This enables the word length to be reduced when a large dynamic range is not required, and consequently enables power consumption to be reduced dynamically, leading to a reduction in average power consumption.

Optionally, the radio receiver may comprise a processing stage for processing data words, the processing stage being adapted to provide power to a variable number of stages of a second register dependent on the length of the data word. In this way, power consumption can be reduced in a dynamic manner, leading to a reduction in average power consumption.

Optionally, the radio receiver may comprise a compensation stage for applying a predetermined compensation for reducing distortion introduced by changing the position of the data word in the first register. Although changing the position of a data word in a register can result in distortion of the signal, the distortion is predictable and can be cancelled in low complexity manner by predetermined compensation, without requiring dynamic estimation of the distortion.

Optionally, the radio receiver may comprise at least one decimation stage, and the analogue to digital converter may be adapted to operate at a relatively high sample rate and the compensation stage may be adapted to operate at a relatively low sample rate. Therefore, the compensation may be performed late in the receiver chain and at a low sample rate, thereby minimising the power consumption of the compensation.

Optionally, the radio receiver may comprise a plurality of gain control stages each adapted to control the numerical value of a data word by controlling the position of the data word in a register. This enables the gain control to be apportioned to different stages of processing in response to the processing performed by those stages.

Optionally, the first register may be a binary register and the controlling of the position of the data word in the first register may comprise a one-bit shift which changes the numerical value of the data word by 6 dB. Binary registers and the use of single-bit shifts enable low complexity. Each one-bit shift can provide a halving, or doubling, of the numerical value of a data word, which corresponds to a decrease, or increase, of 6 dB.

BRIEF DESCRIPTION OF THE DRAWINGS

The invention will now be described, by way of example only, with reference to the accompanying drawings wherein.

DETAILED DESCRIPTION OF EMBODIMENTS

Figure 1:
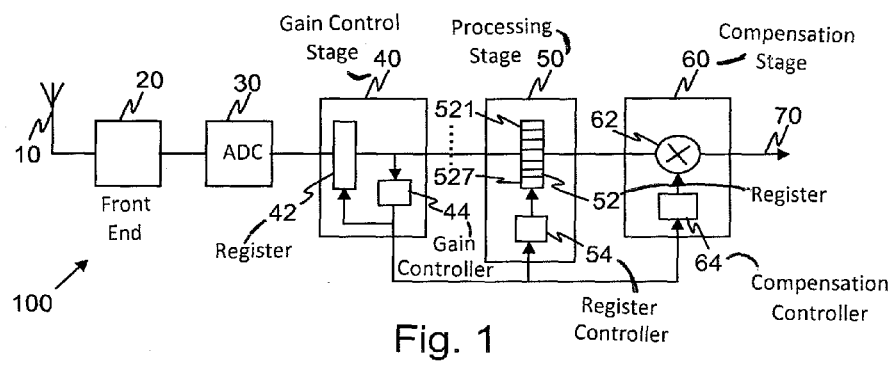
FIG. 1 is a block schematic diagram of a radio receiver.

Referring to FIG. 1, there is illustrated a radio receiver 100 comprising a front end 20 having an input coupled to an antenna 10 for receiving a signal. The front end 20 operates on the received signal in the analogue domain and may include any of amplification, filtering and frequency downconversion. The front end 20 may also include analogue gain control, which is not precluded by the gain control scheme of the present invention which operates in the digital domain. An output of the front end 20 is coupled to an input of an ADC 30, such as a sigma delta ADC.

An output of the ADC 30 is coupled to an input of a gain control stage 40, which has a register 42 for storing one or more data words resulting from digitisation of the received signal by the ADC 30. Data words are written into the register 42 from the ADC 30. The gain control stage 40 has a gain controller 44 which monitors the value of each data word and controls the position of the word in the register 42. The gain control stage 40 illustrated in FIG. 1 monitors the value of the data word which has been stored in the register 42 and controls the position of the data word by shifting the data word in the register 42. In an alternative embodiment, the value of the data word may be monitored before the word is written into the register 42, and the position at which the data word is written into the register 42 may be controlled; in this case the data word does not need to be shifted after having been stored in the register 42.

By controlling the position of the data word in the register 42, the numerical value of the data word is controlled. In particular, if the data word is a binary word and the register 42 comprises binary register stages, changing the position of the data word by one register stage either doubles, or halves, the data value, depending on the direction of the change. In this way, the data value is either increased or decreased by 6 dB.

The gain control stage 40 may change the length of the data word. For example, if the data value is reduced by 6 dB as described above, the least significant bit of the data word may be discarded. If the data value is increased by 6 dB, a least significant bit may be appended to the data word. In conjunction with changing the length of the data word, the gain control stage may vary the number of register stages of the register 42 that are supplied with power, as required to accommodate the data word.

An output of the gain control stage 40 is coupled to an input of a processing stage 50. The processing functions performed by the processing stage 50 on data words received from the gain control stage depend on the application of the receiver, but may include any of at least filtering, decimation, equalisation, demodulation and decoding. The processing stage 50 comprises a register 52 for receiving data words from the gain control stage 42, and a register controller 54. The register controller 54 is coupled to an output of the gain controller 44 and receives an indication of changes in the length of the data words, in response to which the register controller 54 controls the supply of power to the register stages 521 ... 527 of the register 52 as required to accommodate the data words. The processing stage 50 comprises further variable word length registers and processing elements (non-illustrated) as required to perform its function or functions.

The functionality of the gain control stage 40 may be combined with other functions, for example filtering and/or decimation. Therefore, the gain control stage 40 may be a digital filter that combines filtering and decimation with the functionality of the gain control stage 40 described above. Indeed, the functionality of the gain control stage 40 and the processing stage 50 may be combined in a single stage.

An output of the processing stage 50 is coupled to an input of a compensation stage 60 which comprises a multiplier 62 and a compensation controller 64. The compensation controller 64 is coupled to an output of the gain controller 44 and receives an indication of changes in the length of the data words, in response to which the compensation controller 64 delivers a predetermined compensation sequence to the multiplier 62. The compensation sequence is a stored sequence of numerical values, successive values of which are multiplied in the multiplier 62 by successive data values. The compensation sequence is selected to compensate for distortion in the data values caused by changing the position of the data words in the gain control stage 40. The compensation sequence can be determined in advance by experimentation, simulation or calculation. Compensated data values are delivered at an output 70 of the compensation stage 60.

Figure 2:
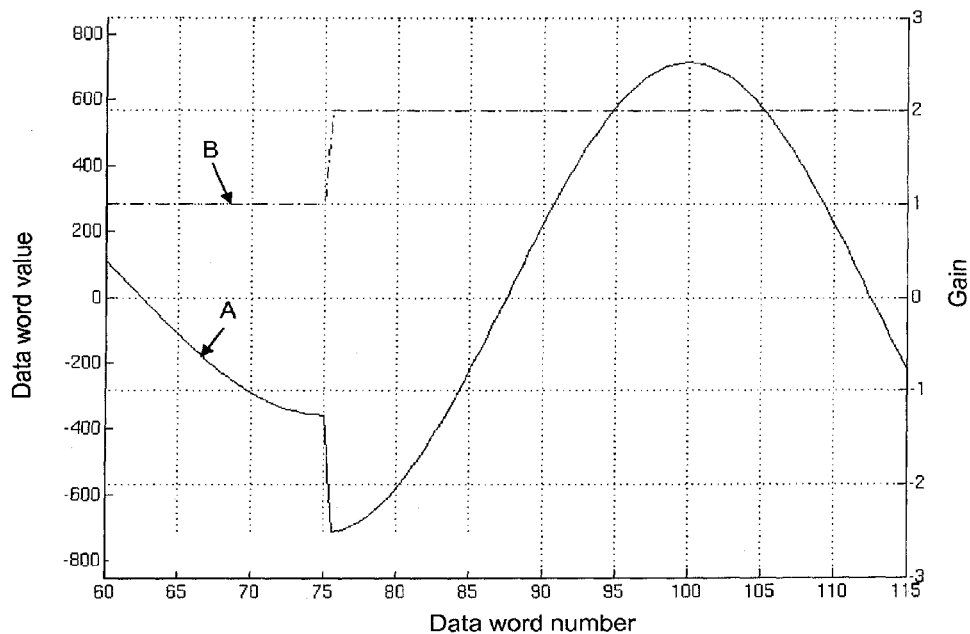
FIG. 2 shows graphs illustrating distortion introduced by a change of gain in the receiver of FIG. 1.
Figure 3:
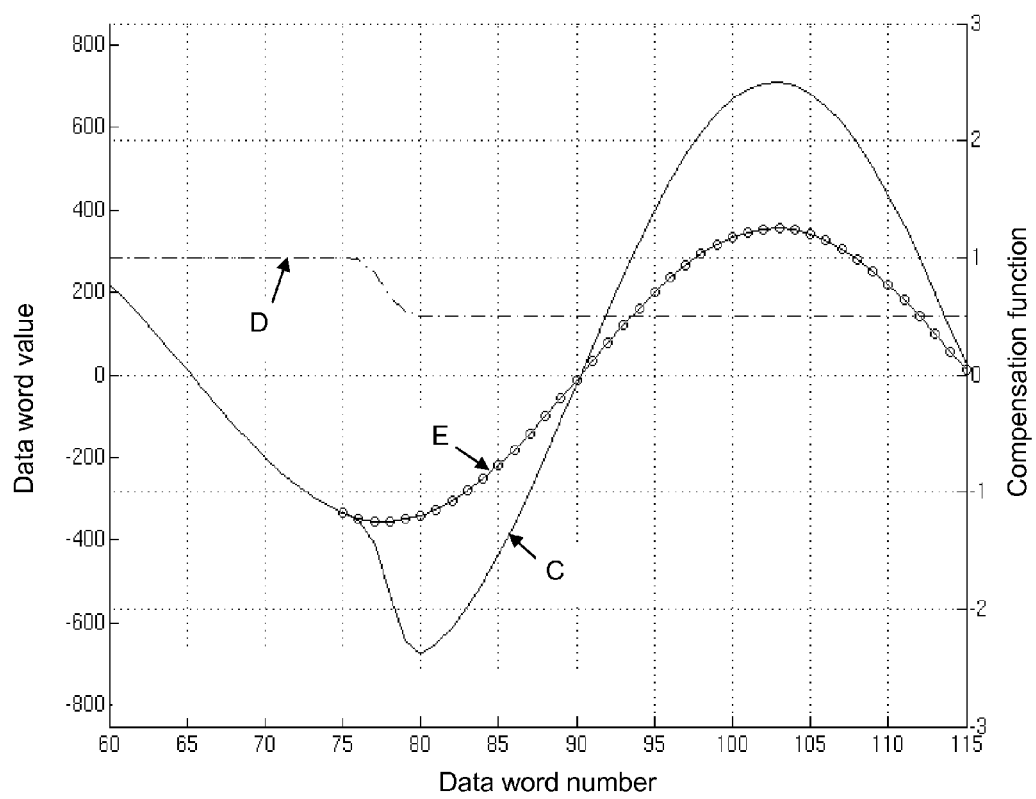
FIG. 3 shows graphs illustrating compensation for distortion introduced by a change of gain in the receiver of FIG. 1.

The process of compensation is illustrated by the graphs of FIGS. 2 and 3, which show the numerical value of a sequence of data words. In FIG. 2, graph A represents the data word values of a sampled sine wave delivered by the AGC 30. Graph B represents the gain, with the gain being doubled, i.e. increased by 6 dB, by the gain control stage 40 at data word number 76 in response to the gain controller 44 detecting at data word number 75 that the amplitude of the sine wave is less than optimum. Consequently, the sine wave of graph A is distorted, having a discontinuity at data word number 76, and thereafter continuing at a greater amplitude. In FIG. 3, graph C represents the data word values at the output of the processing stage 50 after the processing stage 50 has performed filtering on the data words represented by graph A in FIG. 2. This illustrates that the discontinuity has been smoothed, with the distortion now extending between data word number 75 and data word number 80. Graph D in FIG. 3 is a compensation function representing the compensation sequence provided by the compensation stage 60. The compensation function is constant before the discontinuity at data word number 75. In response to the change of gain at data word 75 the compensation function is gradually reduced until data word number 80. Graph E represents the data word values delivered at the output 70 of the compensation state 60 after the compensation has been applied to the data words of graph C, which demonstrates that all the distortion has been removed and the sine wave has been restored.

The output 70 of the compensation stage 60 may be coupled to further processing stages. The order of the processing stage 50 and the compensation stage 60 may be reversed. Any of the elements illustrated in FIG. 1 may be replaced by elements having a different architecture but providing the same functionality. Although the invention has been described with reference to the receiver of FIG. 1 which has a single gain control stage 40, more gain control stages may be provided, each controlling gain in the manner described. This enables the signal amplitude to be controlled at different receiver stages, enabling an optimum amplitude to be maintained at all stages and taking account of amplitude changes resulting from the processing taking place in each stage.

Although embodiments of the invention have been described with reference to binary data words, the invention can also be used with non-binary data and use a non-binary register.

Any or all of the gain control stage 40, the processing stage 50 and the compensation stage 60 may be implemented using a digital signal processor (DSP) or central processing unit (CPU), which may employ embedded software. Any elements of the described embodiments of the invention may be implemented using a hard-wired circuit or circuits, such as an application-specific integrated circuit (ASIC).

From reading the present disclosure, other variations and modifications will be apparent to the skilled person. Such variations and modifications may involve equivalent and other features which are already known in the art of receiver design, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom. For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A radio receiver comprising:
an analogue to digital converter for generating a data word representative of a received radio signal; and
a gain control stage including signal-sampling circuitry, and a register for storing the data word, the gain control stage being adapted to control a numerical value of the data word by monitoring the value of the data word and, in response, controlling a position of the data word in the register, wherein an amount of gain to be applied is established by the signal-sampling circuitry configured for operating at a sampling rate that is lower than a sampling rate at which the analogue to digital converter is configured and arranged to operate, and by the position of the data word in the register.

2. A radio receiver as claimed in claim 1, wherein the gain control stage is adapted to change a length of the data word.

3. A radio receiver as claimed in claim 2, further comprising a processing stage for processing data words, the processing stage being adapted to provide power to a variable number of stages of another register dependent on the length of the data word.

4. A radio receiver as claimed in claim 1, further comprising a compensation stage for applying a predetermined compensation for reducing distortion introduced by changing the position of the data word in the register.

5. A radio receiver as claimed in claim 4, further comprising at least one decimation stage, wherein the analogue to digital converter is adapted to operate at a relatively high sample rate and the compensation stage is adapted to operate at a relatively low sample rate.

6. A radio receiver as claimed in claim 1, wherein the gain control stage is adapted to change a length of the data word, and further including a register controller, coupled to an output of the gain control stage, and configured and arranged to receive an indication of changes in the length of the data word.

7. A radio receiver as claimed in claim 1, wherein the gain control stage is adapted to change a length of the data word, and further including a register controller, coupled to an output of the gain control stage and configured and arranged to receive an indication of changes in the length of the data word, and in response thereto, to control a supply of power to register stages of the register as required to accommodate the data word.

8. A radio receiver as claimed in claim 1, wherein the data word is a binary word and wherein the register includes binary stages and changes the position of the data word in the register by doubling or halving a data value of the data word.

9. A radio receiver as claimed in claim 1, wherein the gain control stage is further configured and arranged to increase the numerical value of the data word by 6 dB and append a least significant bit to the data word.

10. A radio receiver as claimed in claim 1, wherein the gain control stage is further configured and arranged to vary a number of register stages of the register that are supplied with power to accommodate the data word.

11. A radio receiver as claimed in claim 1, wherein the gain stage is further adapted to affect the value of the data word relative to both the location of the register, among a set of registers in which the data word can be written, and the position of the data word in the register.

12. A radio receiver comprising:
an analogue to digital converter for generating a data word representative of a received radio signal;
a gain control stage including a register for storing the data word, the gain control stage being adapted to control a numerical value of the data word by controlling a position of the data word in the register;
a compensation stage for applying a predetermined compensation for reducing distortion introduced by changing the position of the data word in the register;
at least one decimation stage, wherein the analogue to digital converter is adapted to operate at a relatively high sample rate and the compensation stage is adapted to operate at a relatively low sample rate; and
a plurality of gain control stages each adapted to control the numerical value of a data word by controlling the position of the data word in the register.

13. A radio receiver as claimed in claim 1, wherein the register is a binary register and wherein controlling the position of the data word in the register comprises a one-bit shift which changes the numerical value of the data word by 6 dB.

14. A method of operating a radio receiver comprising:
using an analogue to digital converter to generate a data word representative of a received radio signal; and
applying gain control to the data word by controlling a numerical value of the data word by monitoring the value of the data word and, in response, controlling a position of the data word in a register by a shift of at least one bit to provide an amount of gain established by signal-sampling circuitry operating at a sampling rate that is lower than a sampling rate at which the analogue to digital converter is operating, to be applied is established by the position of the data word in the register.

15. The method of claim 14, further including steps of changing a length of the data word; and receiving an indication of changes in the length of the data word.

16. The method of claim 14, further including steps of changing a length of the data word; receiving an indication of changes in the length of the data word; and in response thereto, controlling a supply of power to register stages of the register as required to accommodate the data word.

17. The method of claim 14, further including a step of changing a length of the data word.

18. The method of claim 14, further including a step of applying a predetermined compensation for reducing distortion introduced by changing the position of the data word in the register.

19. The method of claim 14, wherein the value of the data word is affected relative to both the location of the register, among a set of registers in which the data word can be written, and the position of the data word in the register.

20. A radio receiver comprising:
an analogue to digital converter for generating a data word representative of a received radio signal;
a gain control stage including a register for storing the data word, the gain control stage being configured and arranged to control a numerical value of the data word by monitoring the value of the data word and, in response, to control a position of the data word in the register, wherein an amount of gain to be applied is established by the position of the data word in the register; and wherein the gain stage is further adapted to
    affect the value of the data word relative to both the location of the register, among a set of registers in which the data word can be written, and the position of the data word in the register, and
    monitor the value of the data word before the data word is written into the register.

* * * * *